United States Patent
Graff

(10) Patent No.: US 8,658,458 B2
(45) Date of Patent: Feb. 25, 2014

(54) PATTERNED DOPING FOR POLYSILICON EMITTER SOLAR CELLS

(75) Inventor: John Graff, Swampscott, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 184 days.

(21) Appl. No.: 13/160,721

(22) Filed: Jun. 15, 2011

(65) Prior Publication Data

US 2012/0322199 A1    Dec. 20, 2012

(51) Int. Cl.
*H01L 21/00*    (2006.01)
(52) U.S. Cl.
USPC ............................................. 438/97; 438/98
(58) Field of Classification Search
USPC .................................................. 438/97–99
See application file for complete search history.

(56) References Cited

U.S. PATENT DOCUMENTS

| | | | |
|---|---|---|---|
| 6,552,259 B1 | 4/2003 | Hosomi et al. | |
| 7,468,485 B1 | 12/2008 | Swanson | |
| 7,851,698 B2 | 12/2010 | De Ceuster et al. | |
| 2008/0121279 A1 | 5/2008 | Swanson | |
| 2009/0227094 A1 | 9/2009 | Bateman et al. | |
| 2009/0227095 A1 | 9/2009 | Bateman et al. | |
| 2010/0224240 A1 | 9/2010 | Bateman et al. | |

FOREIGN PATENT DOCUMENTS

WO    2009126803 A2    10/2009

*Primary Examiner* — Richard Booth

(57) ABSTRACT

An improved method of manufacturing a polysilicon solar cell is disclosed. To create the polysilicon layer, which has p-type and n-type regions, the layer is grown in the presence of one type of dopant. After the doped polysilicon layer has been created, ions of the opposite dopant conductivity are selectively implanted into portions of the polysilicon layer. This selective implant may be performed using a shadow mask.

14 Claims, 7 Drawing Sheets ized in an ion source, the ions are
PATTERNED DOPING FOR POLYSILICON EMITTER SOLAR CELLS

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity.

Solar cells are one example of a device that uses silicon workpieces. Any reduced cost to the manufacture or production of high-performance solar cells or any efficiency improvement to high-performance solar cells would have a positive impact on the implementation of solar cells worldwide. This will enable the wider availability of this clean energy technology.

Solar cells are typically manufactured using the same processes used for other semiconductor devices, often using silicon as the substrate material. A semiconductor solar cell is a simple device having an in-built electric field that separates the charge carriers generated through the absorption of photons in the semiconductor material. This electric field is typically created through the formation of a p-n junction (diode) which is created by differential doping of the semiconductor material. Doping a part of the semiconductor substrate (e.g. surface region) with impurities of opposite polarity forms a p-n junction that may be used as a photovoltaic device converting light into electricity.

FIG. 1 shows a cross section of a representative solar cell 100, where the p-n junction 120 is located away from the illuminated surface. Photons 10 enter the solar cell 100 through the top (or illuminated) surface, as signified by the arrows. These photons pass through an anti-reflective coating 104, designed to maximize the number of photons that penetrate the substrate 100 and minimize those that are reflected away from the substrate. The ARC 104 may be comprised of an $SiN_x$ layer. Beneath the ARC 104 may be a passivation layer 103, which may be composed of silicon dioxide. Of course, other dielectrics may be used. On the back side of the solar cell 100 are an aluminum emitter region 106 and an aluminum layer 107. Such a design may be referred to as an Al back emitter cell in one instance.

Internally, the solar cell 100 is formed so as to have a p-n junction 120. This junction is shown as being substantially parallel to the bottom surface of the solar cell 100, although there are other implementations where the junction may not be parallel to the surface. In some embodiments, the solar cell 100 is fabricated using an n-type substrate 101. The photons 10 enter the solar cell 100 through the n+ doped region, also known as the front surface field (FSF) 102. The photons with sufficient energy (above the bandgap of the semiconductor) are able to promote an electron within the semiconductor material's valence band to the conduction band. Associated with this free electron is a corresponding positively charged hole in the valence band. In order to generate a photocurrent that can drive an external load, these electron-hole (e-h) pairs need to be separated. This is done through the built-in electric field at the p-n junction 120. Thus, any e-h pairs that are generated in the depletion region of the p-n junction 120 get separated, as are any other minority carriers that diffuse to the depletion region of the device. Since a majority of the incident photons 10 are absorbed in near surface regions of the solar cell 100, the minority carriers generated in the emitter need to diffuse to the depletion region and get swept across to the other side.

Some photons 10 pass through the front surface field 102 and enter the p-type emitter 106. These photons 10 can then excite electrons within the p-type emitter 106, which are free to move into the front surface field 102. The associated holes remain in the emitter 106. As a result of the charge separation caused by the presence of this p-n junction 120, the extra carriers (electrons and holes) generated by the photons 10 can then be used to drive an external load to complete the circuit.

By externally connecting the base through the front surface field 102 to the emitter 106 through an external load, it is possible to conduct current and therefore provide power. To achieve this, contacts 105, typically metallic and in some embodiments silver, are placed on the outer surface of the front surface field 102.

FIG. 2 illustrates a second embodiment of a solar cell 200. In this embodiment, the p-n junction is not created within the substrate 201. Rather, the substrate 201, typically an n-type silicon substrate, is isolated from the back surface by thin oxide tunnel layer 202. The tunnel oxide layer is sufficiently thin to allow electrons to tunnel through the layer 202, such as between 1 and 4 nanometers. This layer 202 may be silicon dioxide or another suitable dielectric material. On the opposite side of the tunnel oxide layer is a polysilicon layer 203. This layer has n-type regions 204a and p-type regions 204b, located adjacent to each other. Where these regions meet, a p-n junction 210 is formed. Contacts 25 are then applied to the n-type regions 204a and p-type regions 204b. In some embodiment, a second tunnel oxide layer 206 exists on the front surface of the substrate 201. In this embodiment, an n-type polysilicon layer 207 may be applied to the second tunnel oxide layer 206.

This embodiment of a solar cell has several advantages. First, its efficiency may be greater than the traditional solar cell of FIG. 1. This may be due to reduced recombination of carriers within the substrate.

However, the production of these polysilicon solar cells is time consuming and costly, requiring many process steps. Therefore, an improved method of manufacturing polysilicon solar cells is needed.

SUMMARY

An improved method of manufacturing a polysilicon solar cell is disclosed. To create the polysilicon layer, which has p-type and n-type regions, the layer is grown in the presence of one type of dopant. After the doped polysilicon layer has been created, ions of the opposite dopant conductivity are selectively implanted into portions of the polysilicon layer. This selective implant may be performed using a shadow mask.

BRIEF DESCRIPTION OF THE DRAWINGS

For a better understanding of the present disclosure, reference is made to the accompanying drawings, which are incorporated herein by reference and in which.

DETAILED DESCRIPTION

The embodiments of the solar cell are described herein in connection with an ion implanter. Beamline ion implanters, plasma doping ion implanters, or flood ion implanters may be used. In addition, other implant systems may be used. For example, an ion implanter without mass analysis or a plasma tool that focuses ions by modifying the plasma sheath may also be used. An ion beam that is focused to only implant specific portions of the solar cell, or grid-focused plasma systems can also be used for the embodiments disclosed herein. However, the gaseous diffusion, furnace diffusion, laser doping, other plasma processing tools, or other methods known to those skilled in the art may be used. In addition, while implant is described, deposition of the doped layers also can be performed. Also, while specific n-type and p-type dopants are listed, other n-type or p-type dopants may be used instead and the embodiments herein are not limited solely to the dopant listed. Thus, the invention is not limited to the specific embodiments described below.

As described above, polysilicon solar cells may offer efficiency advantages that are not possible with conventional solar cells. However, current manufacturing processes for these polysilicon solar cells are expensive and time consuming, thereby affecting their adoptions. One of the major issues associated with the fabrication of these polysilicon solar cells is the formation of a polysilicon layer with n-type regions and p-type regions.

Figure 1:
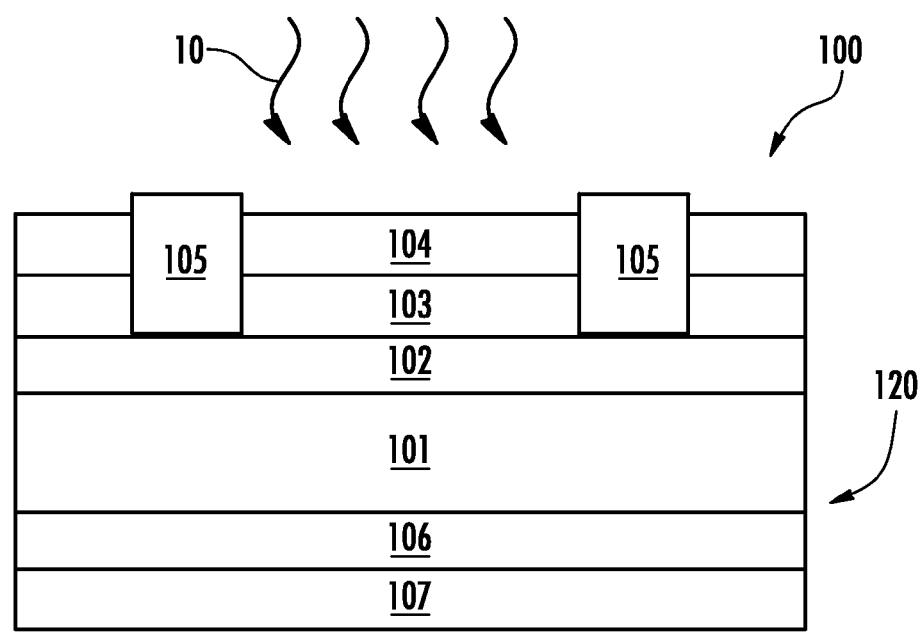
FIG. 1 is a cross-sectional side view of a first embodiment of a solar cell of the prior art.
Figure 2:
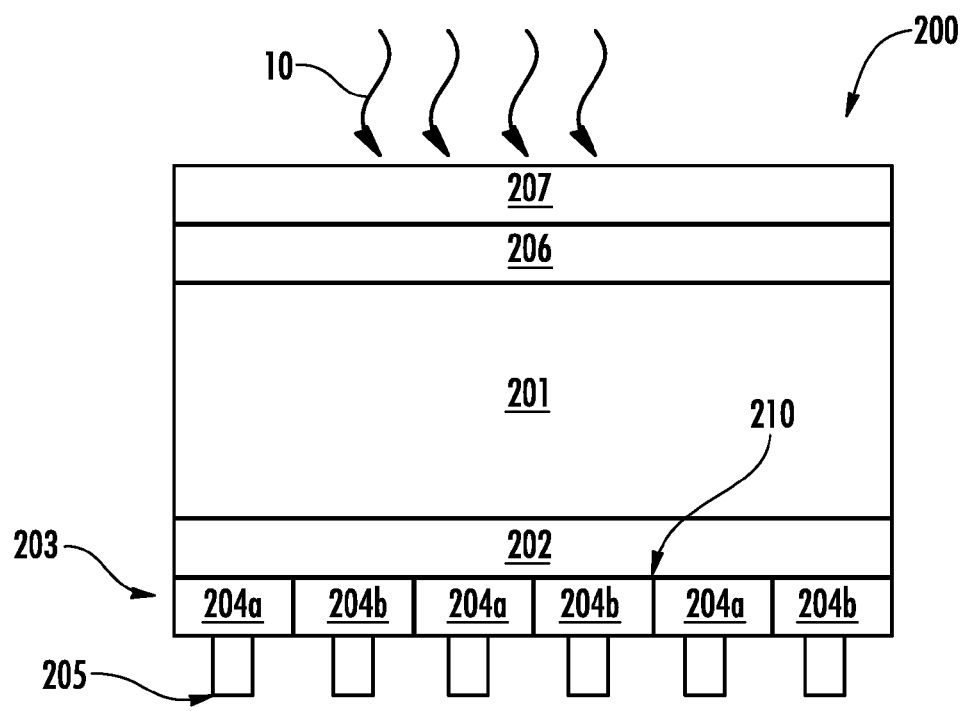
FIG. 2 is a cross-sectional side view of a second embodiment of a solar cell of the prior art.
Figure 3A:
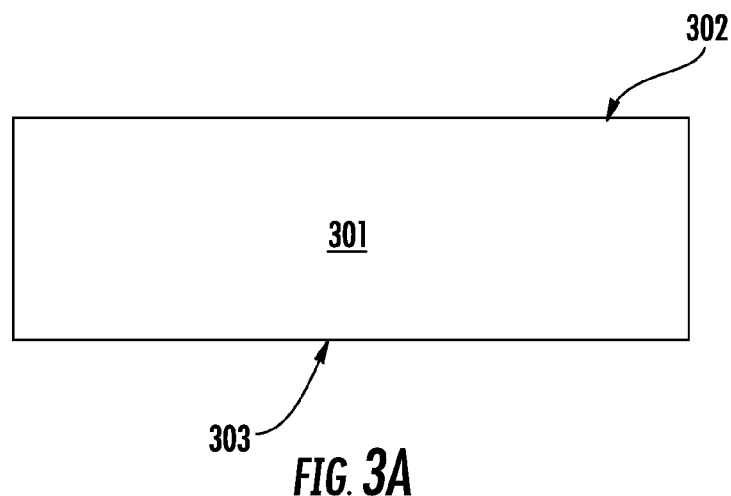
FIGS. 3A-E illustrates one embodiment of the sequence of manufacturing process steps.

FIGS. 3A-E show the sequence of manufacturing steps to create a polysilicon solar cell 300. FIG. 3A shows a substrate 301. This substrate 301 may be any suitable substrate, such as an n-type silicon substrate. The substrate 301 has a front surface 302 and a back surface 303. The front surface 302 is exposed to sunlight, while the electrical contacts will be created on the back surface 303.

Figure 3B:
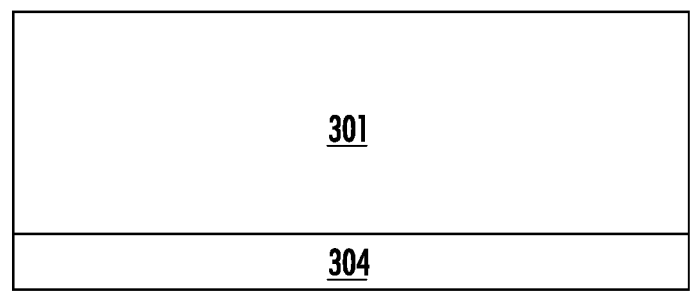

FIG. 3B shows a tunnel oxide layer 304 formed on the back surface 303 of the substrate 301. The tunnel oxide layer may be between about 1 nm and 4 nm in thickness. In some embodiments, thermal oxidation is used to grow the tunnel oxide layer. This process may be performed in a furnace at a temperature above 800° C. to cause oxygen (either molecular oxygen or water vapor) to react with the back surface of the substrate to form silicon dioxide. Thus, both wet and dry oxidation may be used.

Figure 3C:
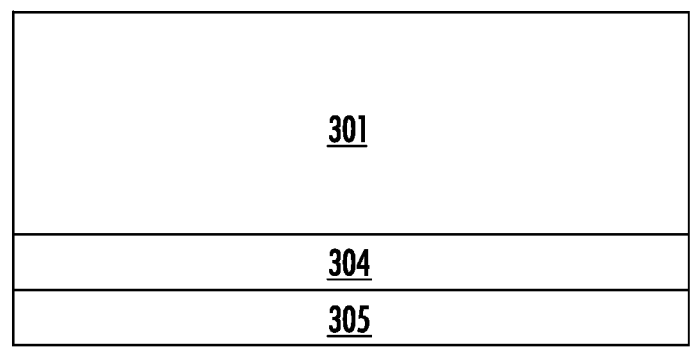

FIG. 3C shows a polysilicon layer 305, which is adjacent to the tunnel oxide 304. In one embodiment, the polysilicon layer 305 is deposited by using silane ($SiH_4$) at low pressure (such as less than 1 Torr) and at temperature ranging from 575° C. to 650° C. This process is also known as low pressure chemical vapor deposition (LPCVD). In other embodiments, atmospheric pressure chemical vapor deposition (APCVD), plasma enhanced CVD (PECVD) or another suitable process may be used to grow the polysilicon layer 305. This layer 305 may be grown while introducing a dopant-containing gas in addition to silane. In one embodiment, diborane ($B_2H_6$) is introduced during the deposition process. This adds p-type dopants to the polysilicon layer as it is grown, thereby creating a p-type region throughout the polysilicon layer 305. In one instance the concentration of boron in the polysilicon layer is between $1e17/cm^3$ and $1e20/cm^3$. In another embodiment, phosphine ($PH_3$) or arsine ($AsH_3$) is introduced during the deposition process, thereby creating an n-type region throughout the polysilicon layer 305. In one instance the concentration of phosphorus (or arsenic) in the polysilicon layer is between $1e17/cm^3$ and $1e20/cm^3$. This polysilicon layer 305 is grown to a thickness of between 50 and 500 nm in one embodiment, although other thicknesses can be used.

Figure 3D:
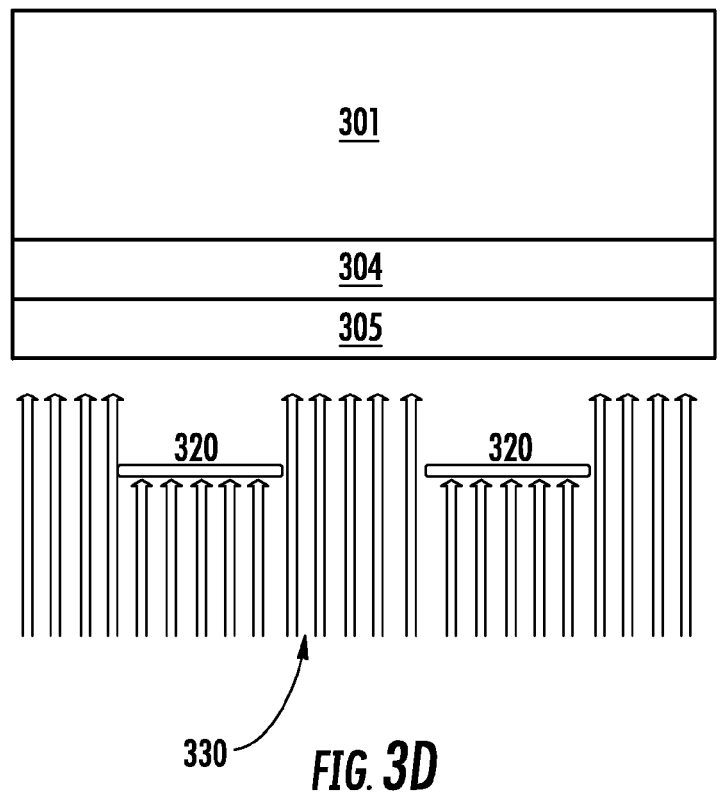

FIG. 3D shows the next step in manufacturing process of the polysilicon solar cell 300. A mask, such as a shadow mask 320, is introduced between the back surface of the substrate 301 and the ion beam 330. This mask 320 is used to prevent the implantation of ions into portions of the polysilicon layer 305. The ions are of a species having a conductivity type opposite than of the dopant introduced during the deposition process. In other words, if a boron-based gas was used during deposition, ions of an n-type dopant, such as a Group V element, for example, phosphorus, will be implanted during this step. Similar, if arsine or phosphine were introduced during deposition, ions of a p-type dopant, such as a Group III, for example, boron, will be implanted during this step.

The amount of dopant of opposite conductivity implanted is sufficient to counterdope the implanted regions. In other words, if the polysilicon layer 305 was deposited with p-type dopant, an amount of n-type dopant is introduced to change the implanted regions to n-type regions. Furthermore, the amount of dopant of opposite conductivity type is sufficient to achieve a net free carrier concentration of between $1e17/cm^3$ and $1e20/cm^3$.

Implant parameters should be chosen such that a substantial majority (for example >90%) of the implanted species resides in the polysilicon layer, and does not penetrate into the tunnel oxide or into the substrate. Implant energies of less than 10 kV are preferred, and <5 kV are especially preferred.

In one embodiment, it is assumed that the polysilicon layer was doped using a p-type dopant during deposition, as shown in FIG. 3C. Therefore, ions of an n-type dopant, such as phosphorus, are implanted in FIG. 3D. The result of these steps is the creation of p-type regions 335 in those regions of the polysilicon layer 305 that were covered by the mask 320, and the creation of n-type regions 336 in those regions of the polysilicon layer 305 that were implanted in FIG. 3D.

In another embodiment, it is assumed that the polysilicon layer was doped using an n-type dopant during deposition, as shown in FIG. 3C. Therefore, ions of a p-type dopant, such as boron, are implanted in FIG. 3D. The result of these steps is the creation of n-type regions 335 in those regions of the polysilicon layer 305 that were covered by the mask 320, and the creation of p-type regions 336 in those regions of the polysilicon layer 305 that were implanted in FIG. 3D.

Figure 4A:
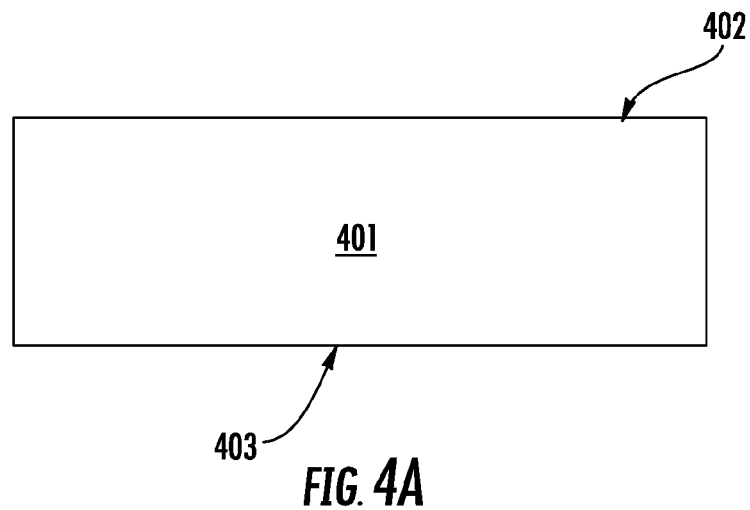
FIGS. 4A-E illustrates a second embodiment of the sequence of manufacturing process steps.

FIGS. 4A-E show the sequence of manufacturing steps to create a polysilicon solar cell 400. FIG. 4A shows a substrate 401. This substrate 401 may be any suitable substrate, such as an n-type silicone substrate. The substrate 401 has a front surface 402 and a back surface 403. The front surface 402 is exposed to sunlight, while the electrical contacts will be created on the back surface 303.

Figure 4B:
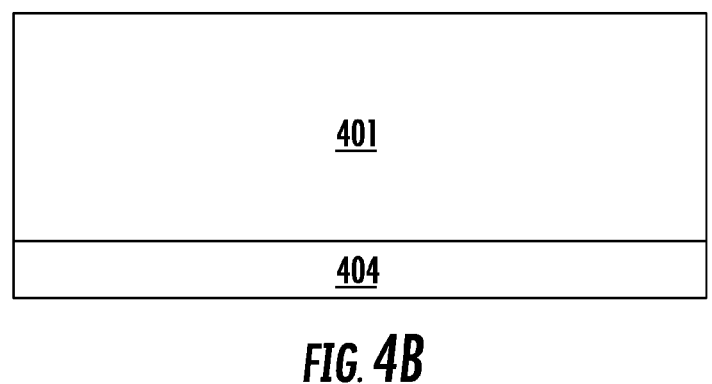

FIG. 4B shows a tunnel oxide layer 404 formed on the back surface 403 of the substrate 401. The tunnel oxide layer may be between about 1 nm and 4 nm in thickness. In some embodiments, thermal oxidation is used to grow the tunnel oxide layer. This process may be performed in a furnace at a temperature above 800° C. to cause oxygen (either molecular oxygen or water vapor) to react with the back surface of the substrate to form silicon dioxide. Thus, both wet and dry oxidation may be used.

Figure 4C:
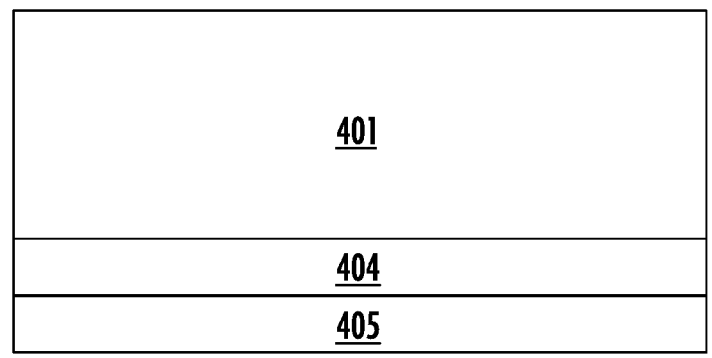

FIG. 4C shows a polysilicon layer 405, which is adjacent to the tunnel oxide 404. In one embodiment, the polysilicon layer 305 is deposited by using silane ($SiH_4$) at low pressure (such as less than 1 Torr) and at temperature ranging from 575° C. to 650° C. This process is also known as low pressure chemical vapor deposition (LPCVD). In other embodiments, atmospheric pressure chemical vapor deposition (APCVD), plasma enhanced CVD (PECVD) or another suitable process may be used to grow the polysilicon layer 405. The polysilicon layer 405 may be grown without introducing dopant gasses during the deposition, which is known to improve uniformity of deposition.

Figure 4D:
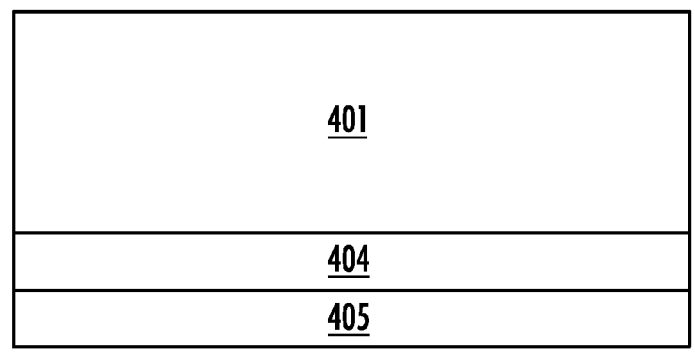
Figure 4D:
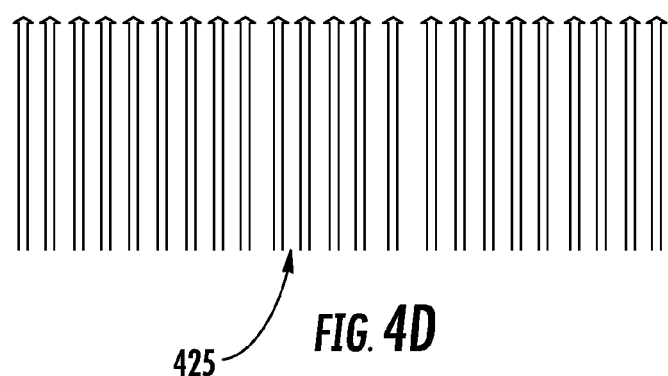

FIG. 4D shows the next step in the manufacturing process of the polysilicon solar cell 400. Ions of a first dopant 425 are implanted in the polysilicon layer 405 to create a polysilicon layer 405 having the conductivity of the first dopant. For example, if phosphorus or another Group V is implanted, the polysilicon layer 405 will become n-type. Conversely, if boron or another Group III is implanted, the polysilicon layer 405 will become p-type. The concentration of dopant implanted is between $1E17/cm^3$ and $1E20/cm^3$. This is a blanket implant where the entire surface of the polysilicon layer 405 is implanted.

Figure 4E:
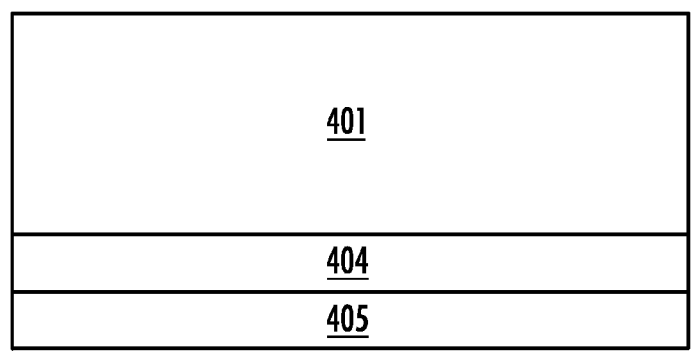
Figure 4E:
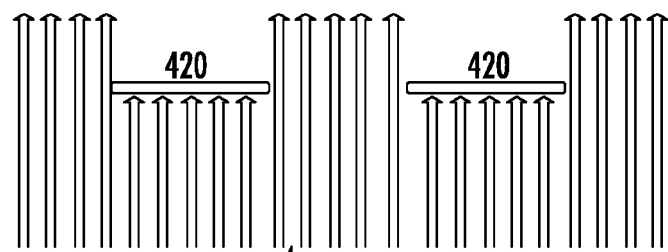

FIG. 4E shows the next step in manufacturing process of the polysilicon solar cell 400. A mask, such as a shadow mask 420, is introduced between the back surface of the substrate 401 and the ion beam 430. This mask 420 is used to prevent the implantation of ions into portions of the polysilicon layer 405. The ions are of a species having a conductivity type opposite than of the dopant implanted during the implantation process of FIG. 4D. In other words, if ions of a Group III element were previously implanted, ions of an n-type dopant, such as a Group V element, for example, phosphorus, will be implanted during this step. Similar, if ions of a Group V element were previously implanted, ions of a p-type dopant, such as a Group III, for example, boron, will be implanted during this step.

It should be noted that the steps shown in FIGS. 4D and 4E may be done in the opposite order. In other words, the patterned implant may be performed first, followed by a blanket implant.

The amount of dopant of opposite conductivity implanted is sufficient to counterdope the implanted regions. In other words, if the polysilicon layer 305 was deposited with p-type dopant, an amount of n-type dopant is introduced to change the implanted regions to n-type regions.

Furthermore, the amount of dopant of opposite conductivity type is sufficient to achieve a net free carrier concentration of between $1e17/cm^3$ and $1e20/cm^3$.

Implant parameters should be chosen such that a substantial majority (for example >90%) of the implanted species resides in the polysilicon layer, and does not penetrate into the tunnel oxide or into the substrate. Implant energies of less than 10 kV are preferred, and <5 kV are especially preferred.

After the ions have been implanted, the solar cell is thermally treated to diffuse the dopants and remove damage caused by implantation. Since polysilicon is used, diffusion can be accomplished with lower temperature, shorter duration thermal processes. For example, thermal cycles of 500° C. to 600° C. for a duration of several seconds to a few minutes can be used. In another embodiment, a rapid thermal anneal (RTP) can be used.

Figure 3E:
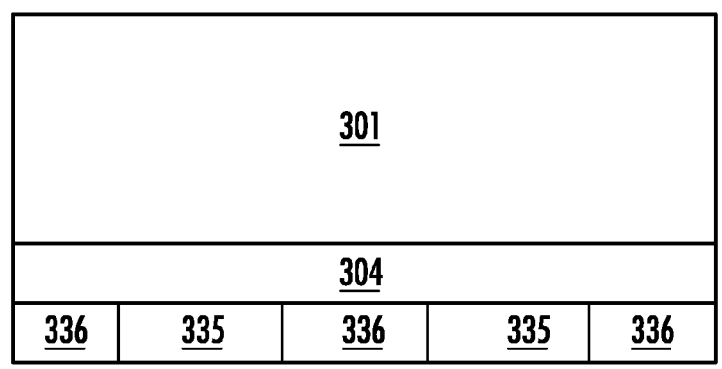

It is recognized that when heavily doped p-type and n-type regions touch each other, as shown in FIG. 3E, there is a risk of parasitic shunting, due to tunneling or other mechanisms. This is especially important in polysilicon materials, which have a large number of defects. Therefore, in some embodiments, a processing step to physically separate the p-type region 335 from the n-type regions 336 is performed to prevent parasitic shunt paths. For example, a laser could be used to create a trench between the n-type and p-type region. Alternatively a trench could be formed using wet chemical etching.

Figure 5A:
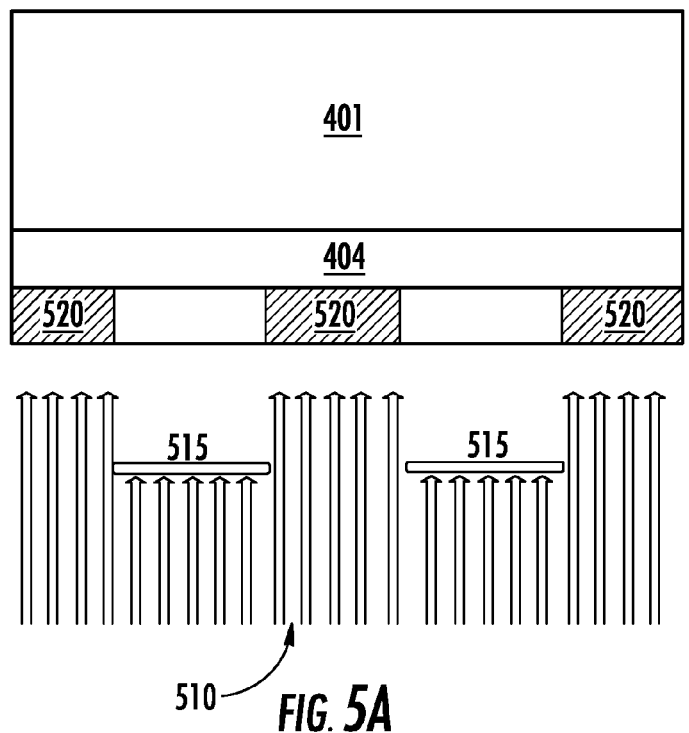
FIGS. 5A-B illustrates a third embodiment of the sequence of manufacturing process steps.
Figure 5B:
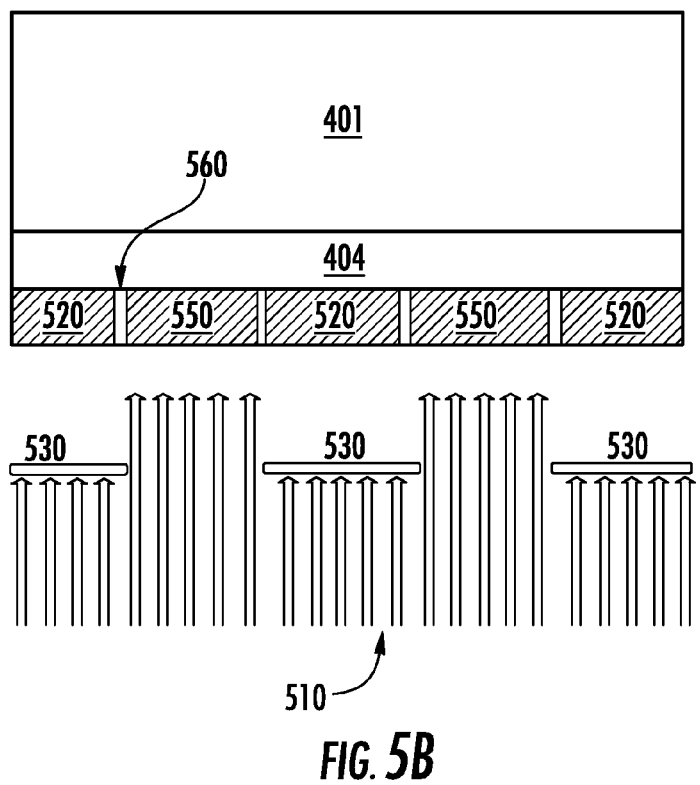

In another embodiment, the substrate is prepared as shown in FIGS. 4A-C. Following these steps, the substrate is then implanted with ions 510 of a first species, using a patterned implant as shown in FIG. 5A. This patterned implant uses a first mask 515 to implant species of a first conductivity type. In one embodiment, the first species is phosphorus or another Group V element. In another embodiment, the first species is boron or another Group III element. This implant creates implanted regions 520.

A second patterned implant, using a second mask 530, which is aligned to the first mask 515, is then performed, as shown in step 5B. An implant using ions 540 of a second species creates implanted regions 550. In the case where the first species was a Group V element, the second species may be boron or another Group III element. Likewise, in the case where the first species was a Group III element, the second species may be phosphorus or another Group V element.

These two masks are designed to be non-overlapping and to guarantee a gap 560 between adjacent implanted regions 520, 550. As described above, the existence or a gap between the n-type regions and the p-type regions reduces parasitic shunting due to tunneling.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of producing a solar cell using a substrate, the method comprising:
    forming a tunnel oxide layer on a surface of said substrate;
    forming a polysilicon layer on said tunnel oxide layer;
    introducing a first mask between said polysilicon layer and a first ion beam to block regions of said polysilicon layer from said first ion beam, thereby implanting ions of a first dopant having a first conductivity into said polysilicon layer and creating first implanted regions therein; and
    introducing a second mask between said polysilicon layer and a second ion beam to block regions of said polysilicon layer from said second ion beam, thereby implanting ions of a second dopant having a second conductivity opposite that of said first conductivity into said polysilicon layer and creating second implanted regions therein having a conductivity opposite that of said first implanted regions, wherein said second mask is aligned to said first mask such that said first implanted regions and said second implanted regions do not touch.

2. The method of claim 1, wherein the tunnel oxide layer is grown on the surface of the substrate using thermal oxidation.

3. The method of claim 1, wherein implant parameters are chosen such that greater than 90 percent of the implanted ions of each of the first dopant and the second dopant reside in the polysilicon layer.

4. The method of claim 1, further comprising thermally treating the solar cell after the first and second dopants have been implanted.

5. The method of claim 1, wherein thermally treating the solar cell comprises subjecting the solar cell to thermal cycles of temperatures between 500 degrees Celsius and 600 degrees Celsius.

6. The method of claim 2, wherein thermally treating the solar cell comprises subjecting the solar cell to rapid thermal annealing.

7. A method of producing a solar cell, the method comprising:
   forming a tunnel oxide layer on a surface of said substrate;
   forming a polysilicon layer on said tunnel oxide layer;
   introducing a first mask between said polysilicon layer and a first ion beam to create first implanted regions in said polysilicon layer, the first implanted regions having a first conductivity; and
   introducing a second mask between said polysilicon layer and a second ion beam to create second implanted regions in said polysilicon layer, the second implanted regions having a conductivity opposite that of said first implanted regions, wherein said second mask is aligned to said first mask such that a gap is formed between adjacent ones of said first implanted regions and said second implanted regions.

8. The method of claim 7, further comprising thermally treating the solar cell after the first and second implanted regions are formed.

9. The method of claim 7, wherein thermally treating the solar cell comprises subjecting the solar cell to thermal cycles of temperatures between 500 degrees Celsius and 600 degrees Celsius.

10. The method of claim 7, wherein thermally treating the solar cell comprises subjecting the solar cell to rapid thermal annealing.

11. A method of producing a solar cell, the method comprising:
   forming a tunnel oxide layer on a surface of said substrate;
   forming a polysilicon layer on said tunnel oxide layer;
   introducing a first mask between said polysilicon layer and a first ion beam to create first implanted regions in said polysilicon layer, the first implanted regions having a first conductivity; and
   introducing a second mask between said polysilicon layer and a second ion beam to create second implanted regions in said polysilicon layer, the second implanted regions having a conductivity opposite that of said first implanted regions, wherein said first and second masks are configured to be non-overlapping to thereby provided a gap is formed between adjacent ones of said first implanted regions and said second implanted regions.

12. The method of claim 11, further comprising thermally treating the solar cell after the first and second implanted regions are formed.

13. The method of claim 11, wherein thermally treating the solar cell comprises subjecting the solar cell to thermal cycles of temperatures between 500 degrees Celsius and 600 degrees Celsius.

14. The method of claim 11, wherein thermally treating the solar cell comprises subjecting the solar cell to rapid thermal annealing.

* * * * *